United States Patent [19]
Ward

[11] Patent Number: 5,424,631
[45] Date of Patent: Jun. 13, 1995

[54] HYBRID INSTANTANEOUS FREQUENCY MEASUREMENT COMPRESSIVE RECEIVER APPARATUS AND METHOD

[75] Inventor: Charles R. Ward, Wayne, N.J.

[73] Assignee: ITT Corporation, New York, N.Y.

[21] Appl. No.: 176,705

[22] Filed: Jan. 3, 1994

[51] Int. Cl.⁶ .......................................... G01R 23/00
[52] U.S. Cl. ............................. 324/76.19; 324/76.35; 324/76.54
[58] Field of Search ............... 324/76.19, 76.23, 76.35, 324/76.52, 76.54, 76.68, 76.77, 77.11, 85

[56] References Cited

U.S. PATENT DOCUMENTS

| | | | |
|---|---|---|---|
| 3,914,554 | 10/1975 | Seidel | 179/15.55 R |
| 4,194,206 | 3/1980 | Tsui et al. | 343/18 |
| 4,200,840 | 4/1980 | Tsui | 324/76.35 X |
| 4,336,541 | 6/1982 | Tsui et al. | 343/18 |
| 4,414,505 | 11/1983 | Cuckson et al. | 324/85 |
| 4,859,934 | 8/1989 | Gale et al. | 324/76.14 X |
| 4,977,365 | 12/1990 | Tsui et al. | 324/78 |
| 5,109,188 | 4/1992 | Sanderson et al. | 324/77 |
| 5,168,215 | 12/1992 | Puzzo | 324/78 |
| 5,220,683 | 6/1993 | Rudish | 324/76.35 X |
| 5,343,207 | 8/1994 | Stromswold et al. | 324/76.35 X |

*Primary Examiner*—Kenneth A. Wieder
*Assistant Examiner*—Glenn W. Brown
*Attorney, Agent, or Firm*—Arthur L. Plevy; Patrick M. Hogan

[57] ABSTRACT

The present invention hybrid instantaneous frequency measurement (IFM) compressive receiver processes a wide bandwidth of incoming signals in two processing channels, where a small time delay is introduced to one of the two channels by a time delay stage. A comb generator provides for folding, or collapsing this wide input band into a much narrower bandwidth by overlapping sub-bands of the input band in the same frequency space. A compressive receiver is coupled to the spectrum folding circuitry for accurately measuring the frequency and amplitude of signals in this folded band, which have a sub-band ambiguity due to the folding. Logic circuitry is included for resolving the sub-band ambiguity in order to provide a unique description of the frequencies of input signals in the wide band input frequency range. The hybrid receiver overcomes the limitations of conventional IFM receivers by providing amplitude as well as frequency information for multiple time overlapped input signals with improved sensitivity. It also overcomes the limitations of a conventional compressive receiver by handling much wider input bandwidths than would otherwise be possible.

25 Claims, 3 Drawing Sheets

HYBRID INSTANTANEOUS FREQUENCY MEASUREMENT COMPRESSIVE RECEIVER APPARATUS AND METHOD

FIELD OF THE INVENTION

The present invention relates generally to an instantaneous frequency measurement receiver with wide input bandwidth coverage and multiple simultaneous signal handling capability.

BACKGROUND OF THE INVENTION

Devices for the instantaneous measurement of signal frequencies have been known and used for some time. The conventional instantaneous frequency measurement (IFM) receiver is a radio frequency (RF) receiver used primarily in electronic warfare (EW). Its basic function is to measure the frequency of pulsed signals radiated from hostile radar.

Generally, it may be said that IFM receivers measure the frequencies of incoming RF signals utilizing interferometric techniques by detecting the phase shift magnitudes produced in multiple calibrated delay lines. For instance, the received RF signal is divided and simultaneously introduced into a non-delayed path and a delay line of known length. Since the phase differences between the delayed and non-delayed receiver paths are functions of the input signal frequency, conversion of the phase difference signals to video provides signals whose amplitudes are related to the phase delay. These video signals are delivered to an encoding network which makes amplitude comparisons of the signals and determines the numerical value of the frequency.

Examples of devices using the above-mentioned techniques can be found in the prior art. See, for example, U.S. Pat. No. 4,194,206, entitled INSTANTANEOUS FREQUENCY MEASUREMENT RECEIVER WITH CAPABILITY TO SEPARATE CW AND PULSED SIGNAL, issued on Mar. 18, 1980 to Tsui and U.S. Pat. No. 5,109,188 entitled INSTANTANEOUS MEASUREMENT RECEIVER WITH BANDWIDTH IMPROVEMENT THROUGH PHASE SHIFTED SAMPLING OF REAL SIGNALS, issued on Apr. 28, 1992 to Sanderson et al., each of which devices have a general construction, as described above.

IFM receivers are capable of covering very broad input bandwidths, i.e., tens of gigahertz (GHz), and providing a quick measure of the frequency of a single dominant input signal. One of the shortcomings of a conventional IFM receiver is that in order to achieve the desired level of accuracy, which is typically several megahertz (MHz), a series of parallel delay paths with increasingly larger delay values are used to perform a number of phase measurements. The larger delay values produce a better frequency measurement accuracy, but also result in a frequency ambiguity because the total delay in these additional paths will most likely exceed the cycle time of the highest frequency. By combining measurements from all of the various delay paths it is possible to remove the ambiguities and obtain the desired frequency measurement accuracy. However, this is all done at the increased expense of added hardware to process the additional channels.

Another principle disadvantage to conventional IFM receivers is that their performance degrades rapidly in the presence of multiple simultaneous signals. This occurs when two or more signals arrive at the receiver in an overlapping time interval. Under these circumstances, if one signal is very much stronger than the others, the stronger signal blocks reception of the weaker signals. Alternatively, if two or more overlapping signals are close in signal strength, the receiver may not be able to reliably measure any of the frequencies of the signals due to the cross-interference.

Other shortcomings of conventional IFM receivers are that they cannot provide amplitude information about the received signals and they generally have poor sensitivity to weaker signals. Thus, in order to measure signal strength or amplitude, other receivers, such as crystal video receivers are generally required in addition to the IFM receivers. The poor sensitivity of conventional IFM receivers stems from the fact that they have a wide instantaneous bandwidth. Accordingly, noise and interference proportional to that bandwidth cannot be prevented from corrupting their performance.

Compressive receivers, on the other hand, are capable of making more precise frequency measurements, and are more capable of handling multiple simultaneous input signals, than are IFM receivers. The function of a compressive receiver is to take an input frequency band consisting of multiple signals and noise and separate the individual components into an ordered time sequence proportional to their frequencies. Thus, compressive receivers perform a real time spectral analysis of the input signals in the input bandwidth. A disadvantage is that they are more limited in input bandwidth frequency than are IFM receivers, i.e., typically less than one GHz.

It is therefore an object of the present invention IFM compressive receiver to combine the advantages of an IFM receiver with that of a compressive receiver in order to provide a receiver having wide input bandwidth coverage combined with high frequency resolution and multiple simultaneous signal handling capability.

It is also an object of the present invention IFM compressive receiver to provide an IFM receiver capable of providing amplitude information about received signals.

It is further an object of the present invention to provide a receiver which can function as an interferometer for the purpose of making angle of arrival measurements on received signals.

SUMMARY OF THE INVENTION

The present invention hybrid instantaneous frequency measurement (IFM) compressive receiver provides a means of processing a wide bandwidth of incoming signals in two processing channels, where a small time delay is introduced in one of the two channels by a time delay stage. Spectrum folding means provides for folding, or collapsing this wide input band into a much narrower bandwidth by overlapping sub-bands of the input band in the same frequency space. Compressive receiver means is coupled to the spectrum folding means for accurately measuring the frequency and amplitude of signals in this folded band, which have a sub-band ambiguity due to the folding. Logic circuitry is included for resolving the sub-band ambiguity in order to provide a unique description of the frequencies of input signals in the wide band input frequency range.

The hybrid receiver overcomes the limitations of conventional IFM receivers by providing amplitude as well as frequency information for multiple time overlapped input signals with improved sensitivity. It also overcomes the limitations of a conventional compressive receiver by handling much wider input bandwidths than would otherwise be possible.

BRIEF DESCRIPTION OF THE DRAWINGS

For a better understanding of the present invention, reference is made to the following description of exemplary embodiments thereof, considered in conjunction with the accompanying drawings, in which.

DETAILED DESCRIPTION OF THE DRAWINGS

Figure 1:
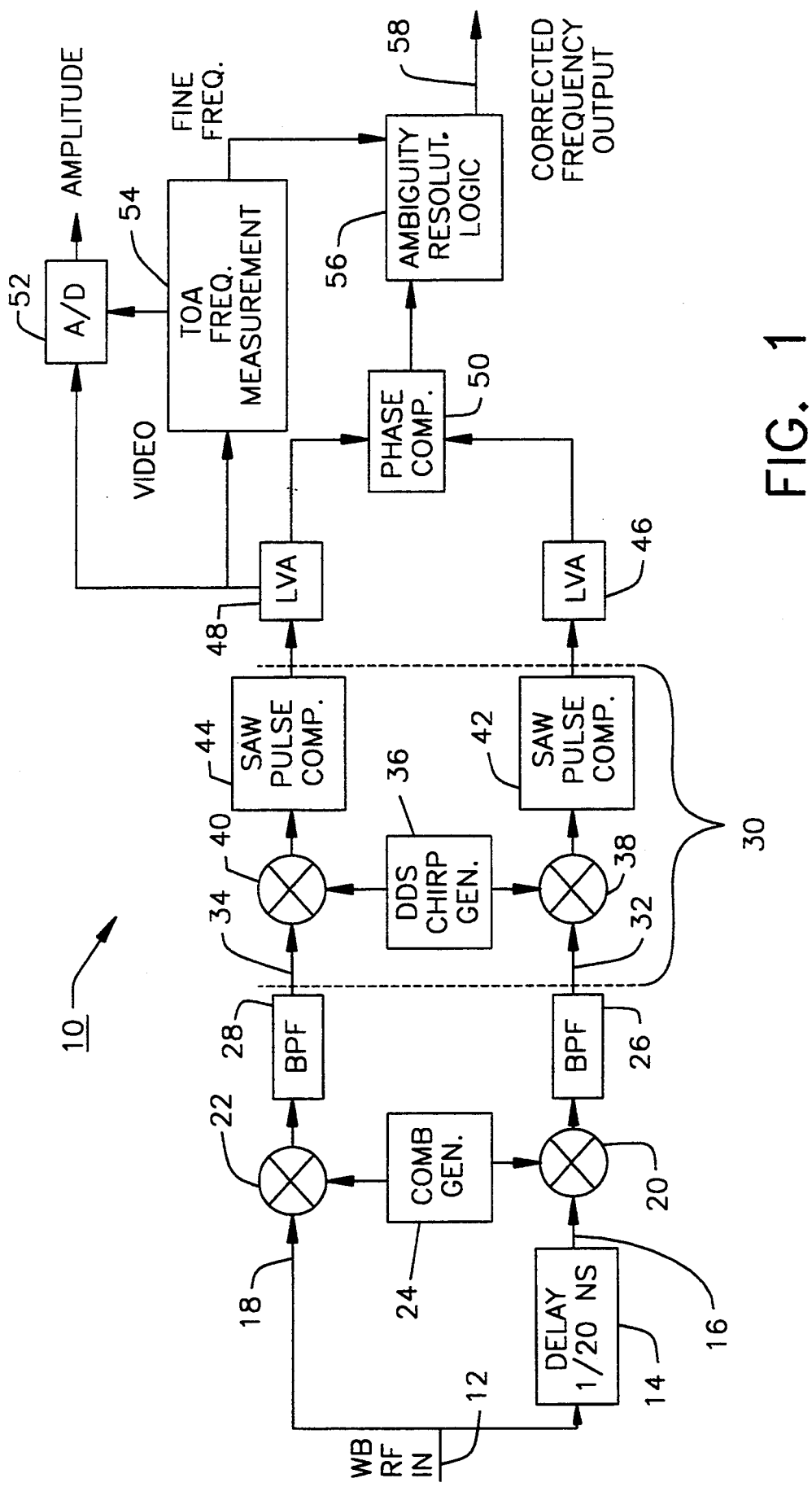
FIG. 1 is a block diagram of a circuit arrangement for the present invention hybrid IFM compressive receiver apparatus and method.

FIG. 1 is a block diagram of one preferred embodiment of the present invention hybrid instantaneous frequency measurement (IFM) compressive receiver 10. This figure can be regarded both as a block diagram of a circuit for the apparatus and as a signal flow diagram for carrying out the method according to the present invention.

A wideband RF signal is received at the input 12 of the hybrid receiver 10, wherein the signal is split into two identical signal paths. A delay stage 14 is included in one of the signal paths for adding a predetermined delay to one of the signals. Techniques for providing a delay to an RF signal are well known in the art. Such techniques include delay lines, such as coaxial delay lines, and acoustic delay lines. The magnitude of the delay provided by the delay stage 14 depends upon the highest frequency of the wideband input signal range over which the receiver 10 is designed to operate. This delay must be less than the period of one cycle for the highest frequency of the wideband input signal, which would be the reciprocal of the frequency. For example, if the receiver 10 were designed to operate over a frequency range extending up to 18 GHz (gigahertz), the delay stage 14 would have a delay of less than 1/18 of a nanosecond, which for clarification sake might be rounded off to 1/20 of a nanosecond. The presence of this delay produces a differential phase shift which is proportional to frequency. The phase shift, however, is never more than 360 degrees, or one cycle. By limiting the maximum phase shift to less than one cycle, a nonambiguous relationship between frequency and phase shift will be maintained.

A mixer 20 is coupled to the output of the delay stage 14 within the delayed path or channel 16 of the receiver 10. The non-delayed path 18 also includes a mixer 22 which accepts the non-delayed wideband RF signal. The output of a comb generator 24 is input to each of the mixers 20,22. The output from each of the mixers 20,22 is coupled to separate bandpass filters 26,28, respectively.

A comb generator is a circuit which outputs a regularly spaced sequence of frequencies at multiples of some specified frequency. The function of the comb generator 24 of the present invention is to produce a coherent summation of frequencies spaced by a predetermined bandwidth and extending over the entire desired input range of the receiver 10. Each of the frequencies of the comb generator 24 functions as a local oscillator signal and translates the wide input bandwidth into a set of multiple overlapping intermediate frequencies (IF). As is known in the art, the use of a local oscillator and mixer configuration can be used to convert an RF signal to an IF frequency that is more convenient for filtering and processing operations. The present operation, however, has the effect of folding all of the signals present in the wideband input into a common bandwidth. In this case the common bandwidth is the bandwidth of a compressive receiver 30, which accepts signals from the delayed and the non-delayed paths 16,18 after those signals exit the bandpass filters 26,28.

Figure 2:
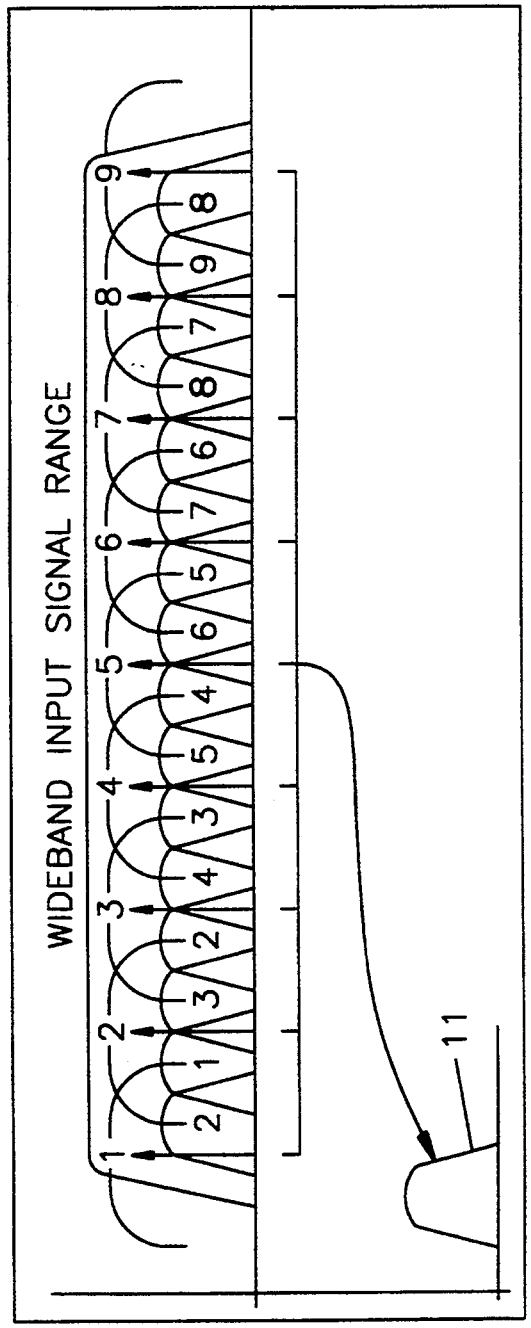
FIG. 2 is an illustration of spectrum folding of the wideband input signal utilizing the present invention.

Referring to FIG. 2, there is shown a representation of the wideband input signal range of the receiver 10 as it is processed by the comb generator 24. If for example, the input signal range of the receiver 10 is 10 GHz and the bandwidth of the compressive receiver channels is 500 MHz, then the comb generator would be programmed to produce nine equally spaced frequencies. These frequencies are represented by the upwardly pointing arrows labeled 1–9, and spaced in frequency by twice the frequency of the channels of compressive receiver 30 or ($2 \times 500$ MHz = 1 GHz). In this case each of the bandpass filters 26,28, would also have pass bands of 500 MHz in order to accommodate the channels of the compressive receiver.

As mentioned, each of the frequencies of the comb generator 24 functions as a local oscillator signal, which when mixed with the wideband input signal by the mixers 20,22 and filtered by the bandpass filters 26,28, convert both the upper and lower sideband regions on either side of the frequency. For example, the frequency represented by the arrow 5, converts the two sidebands labeled as 5' and 5" to difference frequencies as shown on the lower axis 11. Note that both upper and lower sidebands are overlapped at the output. Similarly, each of the other frequencies 1–4 and 6–9, from the comb generator convert their respective sidebands in the input signal range to the same overlapping output frequency range. In this way, the entire wideband input signal range has been folded and collapsed into a narrower bandwidth, which in this case is 500 MHz. Of course, more or less frequencies may be required depending on the wideband input signal range of the receiver 10.

After bandfolding has occurred by means of the comb generator 24 and associated circuits, any signal occurring in the wideband input signal range will manifest itself somewhere within the narrower output frequency range, which in the case of the above example would be 500 MHz. Due to all the overlapping from different frequency sub-bands present in the wideband input signal range, many different input signals could produce the same output frequency after band folding occurs. Therefore, if one were to examine only one of the two signal paths 16,18 of the receiver 10, there would be an unresolvable frequency ambiguity, since there would be no way of telling from which one of the input sub-bands the signal had originated. The phase shift, however, which is proportional to the input frequency, and which was introduced by the delay stage 14 in the delayed signal path 16 permits this ambiguity to be resolved.

One would need only to measure the differential phase between the delayed channel and the non-delayed channel 16,18 to an accuracy sufficient to determine from which of the sub-bands the observed signal originated. For example, if a wideband input signal range of 18 GHz was folded into 36 sub-bands of 500 MHz each, and the entire 18 GHz range corresponded to less than one cycle (360 degrees) of phase shift, then a phase measurement accuracy of 360 degrees/36 sub-bands=10 degrees would permit the ambiguity to be resolved. Note that fewer sub-bands reduces the differential phase accuracy measurement requirement, but also reduces the maximum unambiguous input frequency range.

It should be noted that the process of spectrum folding described herein, is identical to the aliasing process that occurs when wideband signals are sampled at less than their Nyquist rate, i.e., twice the bandwidth of the input signal. Therefore, an alternative, or equivalent technique would correspond to sampling the wideband input signal with a narrow time aperture sample and hold device clocked at a frequency corresponding to the frequency spacing of the comb generator 24, as described above. It should also be noted that other spectrum folding techniques are possible, and may under some circumstances, be preferable. For example, due to device performance limitations, or distortion, such as spurious responses, due to non-linearities in the spectrum folding process using comb local oscillators, it may be preferable to filter out each of the comb frequencies and mix them with the input signal separately in individual mixers. While this would require additional hardware, and care in the design of the filter bank to maintain coherency between filter elements, it would probably result in better intermodulation performance. This technique would also be advantageous in that it would be possible to turn off individual sub-bands to eliminate known unwanted signals, reduce noise, and improve receiver sensitivity.

Referring back to FIG. 1, it can be seen that each of the bandpass filters 26,28 is coupled in an input of the compressive receiver 30. The compressive receiver 30 includes two input channels 32,34, each of which correspond to the delayed and non-delayed signal paths 16,18, respectively. After spectrum folding has been accomplished, the signals in each of the two channels 32,34 can be processed as in a conventional compressive receiver channel. Both channels 32,34 are driven from a common chirped local oscillator 36 to maintain coherency. Mixers 38,40 receive a common signal from the chirped oscillator 36, wherein that signal is mixed with corresponding signals from the delayed and non-delayed paths 16,18 of the receiver 10. An output from each of the mixers 38,40 is coupled to one of the corresponding surface acoustical wave (SAW) pulse compressors 42,44.

A SAW pulse compression unit may consist of an input transducer and output transducer mounted on a piezoelectric substrate. These transducers are normally implemented as interdigital devices which consist of a metal film deposited on the surface of the acoustic medium. This metal film is comprised of fingers that dictates the frequency characteristics of the unit. The input transducer converts an electrical signal into a sound wave with over 95 percent of the energy traveling along the surface of the medium. The output transducer taps a portion of this surface sound wave and converts it back to an electrical signal.

The function of the compressive receiver 30 is to take an input frequency band consisting of multiple signals and noise and separate the individual frequency components into an ordered time sequence proportional to their frequencies. The amplitude of the time sequence is also proportional to the amplitude of the frequency component. This process is functionally equivalent to performing a Fourier transform on regularly spaced intervals of the input signal waveforms. It can also be thought of as performing the function of a spectrum analyzer, except that unlike the spectrum analyzer, phase information regarding the signal components is preserved. For example, if the input to the compressive receiver 30 is a set of unmodulated (CW) frequencies, then the output of the compressive receiver 30 is a sequence of narrow pulses which are positioned in time in proportion to their frequencies. Within the envelope of these narrow pulses there exists a carrier frequency determined by a receiver frequency plan, in which the phase relative to the envelope is a function of the phase of this frequency component of the input signal.

The mixing action of the chirped local oscillator 36 with the input signal from the delayed and non-delayed path 16,18 results in a chirped output signal. The pulse compression filters 42,44 are matched having a chirped impulse response of equal magnitude, but opposite polarity which causes the chirped inputs to be compressed in time to very narrow pulses. The time of occurrence of these pulses, relative to the sweep intervals of the chirped local oscillator 36, are proportional to the frequency of the input signal. The amplitude of the pulse is also proportional to the input signal amplitude. If multiple input signals are present, multiple output pulses are produced each of which are spaced in time proportional to their corresponding frequencies and having amplitudes proportional to their corresponding amplitudes.

Figure 3:
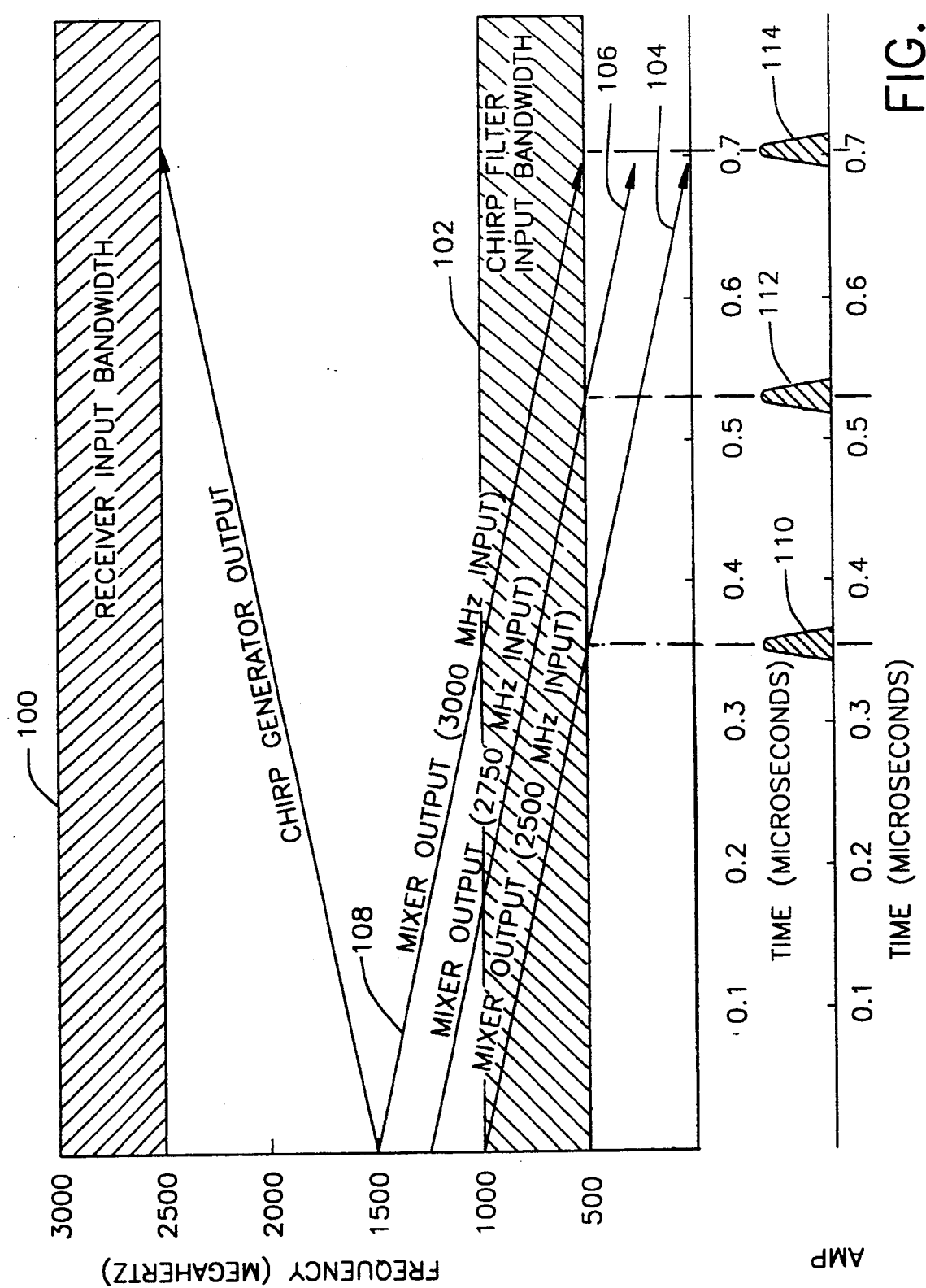
FIG. 3 shows a time frequency diagram illustrating operation of the present invention compressive receiver.

The operation of a compressive receiver channel 32,34 is best described using a time-frequency diagram. Referring to FIG. 3, there is shown an arbitrary frequency plan which has been selected by way of example. In practice, the center frequency of the SAW pulse compressor, the desired input frequency range, spurious responses considerations, and the chirp generator hardware, among other things, all contribute to the choice of a particular frequency plan.

The top portion 100 of the time-frequency diagram describes a compressive receiver 30 designed to process input signals in the range between 2.5 and 3.0 GHz. Since this input frequency range does not change as a function of time, it is depicted as the shaded rectangle 100 at the top of the figure. Similarly, the SAW pulse compressor 42,44, which is often referred to as a chirp filter, also responds to a fixed band of frequencies in the range from 500 MHz to 1000 MHz, and so is depicted as shaded rectangle 102. Within this frequency range the chirp filter 42,44 has a time delay which is linearly proportional to frequency. Accordingly, if an input signal corresponding to an inverse (but equal magnitude) slope chirp is input to the chirp filter 42,44, the first portion of the input chirp is delayed longer than the last portion of the input chirp. If the chirp slopes are inversely matched, then all components of the input chirp waveform will arrive at the chirp filter output at the same instant of time, producing a narrow, but large amplitude pulse.

In the example shown in the time frequency diagram of FIG. 3, a set of three CW frequencies 104,106,108 corresponding to 2500, 2750, and 3000 MHz are mixed with the chirp local oscillator 36 starting at 1.5 GHz and extending to 2.5 GHz over an interval of 0.7 microseconds. The resulting difference frequencies correspond to inverse, identical slope chirp waveforms, where the start and stop frequencies vary in proportion to the input signal frequencies. As a result, each input signal's chirp component sweeps through the chirp filter 42,44 during a different interval, which in turn produces compressed output pulses 110,112,114 at different times. Note that in FIG. 3, the video envelope of the pulses 110,112,114 are shown on the lower axis to clarify the figure. In reality, the output of the chirp filter 42,44 consists of a pulse modulated burst of RF. In any event, in the example, the mixer 38,40 output chirp due to the 2500 MHz signal begins to enter the chirp filter 42,44 immediately, and has completely swept through the chirp filter, and produced a compressed pulse in 0.35 microseconds.

The process described by the time-frequency diagram of FIG. 3 is repeated every 0.7 microseconds, resulting in a new analysis of the 500 MHz input band at that rate. Note that the sweep duration of the chirp generator 36, is twice that of the dispersion time (0.350 microsecond impulse response duration) of the chirp filter 42,44. The compression of signal energy in this interval into a narrower pulse represents a signal processing gain which improves the output signal to noise ratio. This processing gain is defined in terms of the time-bandwidth product of the chirp filter. In the example, this processing gain would be equal to 500 MHz$\times$0.350 microseconds=175, or approximately 22 dB. Although not specifically illustrated, the amplitude of each of the compressed pulses at the chirp filter output are directly proportional to the strength of the signals that produce them over the useable range of the receiver 10.

Referring once again to FIG. 1, it can be seen that the outputs from each of the channels 32,34 of the compressive receiver 30 are coupled to respective successive detection log video amplifiers 46,48. More specifically, the output from the pulse compressor 42 of the delayed signal path 16 is coupled to a first log video amplifier 46. In a similar fashion, the pulse compressor 44 of the non-delayed signal path 18 is coupled to a second log video amplifier 48. Logarithmic devices, such as the log video amplifiers 46,48 are devices whose output is proportional to the to the logarithm of the envelope of the IF input. They often approximate the logarithmic characteristics by a multiplicity of linear segments. The log video amplifiers 46,48 also provide a limiting function. When signals are received that saturate some stage of a radar receiver which is not expressly designed to cope with such a situation, the distortions of operating conditions can persist for some time after the signal disappears. Video stages are most vulnerable and take longer to recover than IF stages. Thus, it is customary to include a limiter in the last IF stage, designed to quickly regain normal operating conditions immediately following the disappearance of a limiting signal. The limiter may be set either to prevent saturation of any subsequent stage or to allow saturation of an A/D converter.

An output from the second log video amplifier (LVA) 48 is coupled to an analog to digital (A/D) converter 52. As is well known in the art the function of an A/D converter is to accept an analog signal and convert this signal into a corresponding digital representation which may be more conveniently processed. The video signal from the LVA 48 which is input to the A/D converter 52 enables a calculation of the amplitude of the pulse envelope to determine signal strength. An output from the LVA 48 is also coupled to a time of arrival (TOA) frequency measurement device 52. The TOA device 54 accomplishes a fine frequency measurement, however this frequency measurement still contains a sub-band ambiguity due to the spectrum or frequency folding which had taken place earlier.

Outputs from each of the two LVAs 46,48 are additionally coupled to a phase detector 50 for measuring the differential phase from the two channels. Examples of commonly used phase detector circuits include balanced diode detectors, multiplier detectors, coincidence detectors, as well as analog to digital phase detectors. It can be ascertained that since the two compressive receiver channels 32,34 shown in the block diagram of the hybrid receiver 10 are being coherently driven from the same local oscillator source 36, any differential phase difference between components of the input signals are translated directly to the differential phase inside the envelope of the corresponding compression pulses. By hardlimiting each of the compressive channels 32,34, for example, by using the limiting output available from most successive detection log video amplifiers 46,48 and providing these limited outputs to the phase detector 50, the differential phase shift can be measured at the time corresponding to the peak amplitude of the pulses.

The output of the phase comparator 50 is coupled to resolution circuitry 56 for resolving the frequency band ambiguity created as a result of the spectrum folding. An output from the TOA device is also coupled to the resolution circuitry 56. The resolution circuitry may take the form of an encoding network or other processing means which would include a microprocessor, microcontroller or other computing means. It will be understood that the time delay created by the delay stage 14 does not produce any measurable difference in the envelope of the compressed output pulses of the compressive receiver 30, but does produce a measurable phase difference in the carrier frequencies inside the envelopes of the compressed pulses resulting in both channels 32,34. This phase difference is proportional to the frequency of the input signal over the full wideband input signal bandwidth, and therefore can be used to resolve which folded segment of the overlapping input signal produced each output compressed pulse. By combining the frequency information from the TOA device 54 with the measured phase differential, a corrected description of the frequencies of input signals in the wide band input frequency range is then available at the output 58 of the receiver 10.

A possible disadvantage of the present invention hybrid receiver 10, is that two input signals having a specific frequency relationship could produce time overlapped compressed pulses at the output of the receiver. In this case the stronger of the two signals would tend to obscure the weaker signal. However, since the compression ratio of the chirped local oscillator sweep time to the width of the compressed output pulse is typically between 100 and 1,000, the probability of this occurring is minute.

Angle of arrival measurements can also be performed on the input signal using the identical hardware described in FIG. 1. By removing the delay stage 14 and replacing the comb generator 24 with a single local oscillator frequency, the receiver 10 of the present invention can be made to function as an interferometer for the purpose of making angle of arrival measurements. In this case each of the two receiver channels 16,18 would be connected to separate input antenna ports. The phase shifts produced by the delay in signal arrival times could be measured using the receiver 10 as previously discussed. This would enable the simultaneous measurement of input signal frequency, amplitude and angle of arrival using the same basic set of hardware. A general extension of this technique would incorporate additional degrees of freedom by adding more antenna elements, each of which are connected to a corresponding receiver channel.

The present invention hybrid receiver 10 may be implemented using a variety of different hardware technologies, including analog, digital and combinations of the two. Examples of analog hardware that could be used to implement the pulse compressors, i.e. chirp filters or dispersive delay lines, include surface acoustic wave (SAW), charge transfer or charge coupled devices (CCD/CTD) and acoustic charge transport (ACT) devices. Digital realizations of the pulse compressor function include finite impulse response (FIR) digital filters programmed as dispersive delay lines to implement the chirp-z transform algorithm, as well as a variety of fast fourier transform algorithms.

If analog techniques are employed to implement the receiver 10, it would be likely that a periodic calibration signal would be required to be injected at the input of the receiver system to calibrate out temperature and other time dependent drifts in the hardware performance.

It will be understood that the present invention hybrid IFM compressive receiver apparatus and method described herein are merely exemplary and that a person skilled in the art may make many variations and modifications to the described embodiments utilizing functionally equivalent components to those described. As such, variations and modifications, including differing hardware and functionally equivalent circuit arrangements are intended to be within the scope of the invention as described in the appended claims.

What is claimed is:

1. An instantaneous frequency measurement apparatus for measuring the frequency of a wideband RF input signal, said apparatus comprising:
    time delay means responsive to said wideband input signal for introducing a time delay to said signal to provide at an output a time delayed wideband signal;
    spectrum folding means responsive to said wideband input signal and said delayed wideband signal for collapsing each said wideband signal into a narrower bandwidth having frequency ambiguity;
    compressive receiver means coupled to said spectrum folding means for accurately measuring frequencies of signals contained in said narrower bandwidth; and
    logic means coupled to said compressive receiver means for resolving said frequency ambiguity to thereby provide an output signal representative of frequencies found in said wideband input signal.

2. The apparatus of claim 1, wherein said compressive receiver means further includes means for measuring the amplitude of signals contained in said narrower bandwidth.

3. The apparatus of claim 2, wherein said amplitude measuring means includes an analog to digital converter.

4. The apparatus of claim 1, wherein said spectrum folding means includes a sample and hold device for sampling said wideband input signal and said delayed wideband signal at series of regularly spaced predetermined intervals.

5. The apparatus of claim 1, wherein said spectrum filter means includes:
    filter means for filtering a series of regularly spaced frequencies at a predetermined interval;
    multiple mixing means coupled to said filter means for mixing said wideband input signal and said delayed wideband signal with said frequencies of said filter means.

6. The apparatus of claim 5, wherein said filter means includes means for selectively turning off and on individual frequencies from said series of regularly spaced frequencies.

7. The apparatus of claim 1, wherein said compressive receiver means includes:
    chirped local oscillator;
    mixing means coupled to said chirped local oscillator and said spectrum folding means for mixing signals from said spectrum folding means with signals from said local oscillator; and
    pulse compressor means coupled to said mixing means for compressing chirped signals output from said mixing means.

8. The apparatus of claim 7, wherein said compressive receiver means includes delayed and non-delayed signal paths, said receiver means further including:
    first and second logarithmic video amplifiers coupled to said delayed and non-delayed signal paths, respectively, of said pulse compressor means; and
    phase comparator coupled to each of said logarithmic video amplifiers for determining the phase difference between signals in said delayed and non-delayed signal paths.

9. The apparatus of claim 8, wherein said compressive receiver means further includes means for accomplishing time of arrival (TOA) frequency measurements.

10. The apparatus of claim 9, wherein said logic means is coupled to said phase comparator and said TOA frequency measurement means.

11. The apparatus of claim 1, wherein said spectrum folding means includes:
    comb generator for generating a series of regularly spaced frequencies at a predetermined interval;
    first and second mixing means coupled to said comb generator for mixing said wideband input signal and said delayed wideband signal, respectively, with said frequencies of said comb generator; and
    filter means coupled to each of said first and second mixing means for passing only a desired band of frequency to outputs of said spectrum folding means.

12. The apparatus of claim 1, further including angle of arrival (AOA) measurement means coupled to said spectrum folding means.

13. The apparatus of claim 12, wherein said AOA measurement means includes:
    single frequency local oscillator coupled to said spectrum folding means; and
    a plurality of antenna input ports coupled as inputs to said spectrum folding means.

14. The apparatus of claim 1, wherein said compressive receiver means includes hardware devices selected from the group consisting of surface acoustical wave (SAW), charge coupled device (CCD), charge transfer device (CTD) and acoustic charge transport (ACT) devices.

15. The apparatus of claim 1, wherein said compressive receiver means includes finite impulse response (FIR) digital filters programmed as dispersive delay lines.

16. An instantaneous frequency measurement apparatus for measuring the frequency of a wideband RF input signal, said apparatus comprising:

time delay means responsive to said wideband input signal for introducing a time delay said signal to provide at an output a time delayed wideband signal;

spectrum folding means responsive to said wideband input signal and said time delayed wideband signal for overlapping sub-bands of each said wideband signal within a separate narrower predetermined bandwidth, wherein each sub-band present in said predetermined bandwidth contains a frequency ambiguity as a result of said overlapping;

compressive receiver means coupled to said spectrum folding means for accurately measuring frequencies of signals contained in said predetermined bandwidth and for resolving said frequency ambiguity thereby providing an output signal representative of frequencies found in said wideband input signal.

17. The apparatus of claim 16, wherein said compressive receiver means further includes means for measuring the amplitude of signals contained in said narrower bandwidth.

18. The apparatus of claim 16, wherein said spectrum folding means includes:

comb generator for generating a series of regularly spaced frequencies at a predetermined interval;

mixing means coupled to said comb generator for mixing said wideband input signal and said delayed wideband signal, respectively, with said frequencies of said comb generator; and filter means coupled to said mixing means for passing only a desired band of frequency to outputs of said spectrum folding means.

19. The apparatus of claim 16, further including angle of arrival (AOA) measurement means.

20. A method of measuring the instantaneous frequency of a wideband RF input signal comprising the steps of:

providing said wideband input signal at first and second signal paths;

introducing a time delay in said second signal path;

spectrum folding said wideband input signal of said first and second signal paths into a plurality of overlapping sub-bands contained in a narrower predetermined bandwidth, wherein each of said sub-bands contains a frequency ambiguity;

measuring the frequencies of signals contained in said predetermined bandwidth by means of a compressive receiver;

determining the phase difference between said first and second signal paths created from said time delay; and resolving said frequency ambiguity of each of said sub-bands by making use of said measured frequencies and said phase difference information, thereby providing an output signal representative of frequencies found in said wideband input signal.

21. The method of claim 20, wherein said step of spectrum folding includes the steps of:

generating a comb of regularly space frequencies at a predetermined interval;

mixing said wideband input signal of said first and second signal paths with said comb of frequencies; and filtering the mixed signals of said first and second signal path, whereby only a desired band of frequency is passed.

22. The method of claim 20, wherein said step of spectrum folding includes the step of sampling said wideband input signal at a series of regularly spaced predetermined intervals.

23. The method of claim 20, wherein said step of spectrum folding includes the steps of:

filtering a series of regularly space frequencies at a predetermined interval;

mixing said wideband input signal of said first and second signal paths with said regularly space frequencies.

24. The method of claim 23, further including the step of selecting individual frequencies to be passed along for measurement from said series of regularly spaced frequencies.

25. The method of claim 20, wherein said step of measuring includes the steps of:

generating signals from a chirped local oscillator;

mixing signals from each of said first and second paths of a spectrum folding means with signals from said local oscillator; and compressing chirped signals from said mixing means.

* * * * *